(12) United States Patent
Harari

(10) Patent No.: US 7,502,261 B2
(45) Date of Patent: Mar. 10, 2009

(54) FLASH MEMORY CELL ARRAYS HAVING DUAL CONTROL GATES PER MEMORY CELL CHARGE STORAGE ELEMENT

(75) Inventor: Eliyahou Harari, Saratoga, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/379,004

(22) Filed: Apr. 17, 2006

(65) Prior Publication Data

US 2006/0176736 A1 Aug. 10, 2006

Related U.S. Application Data

(62) Division of application No. 10/791,486, filed on Mar. 1, 2004, now Pat. No. 7,075,823, which is a division of application No. 10/282,747, filed on Oct. 28, 2002, now Pat. No. 6,888,755.

(51) Int. Cl.
*G11C 11/34* (2006.01)

(52) U.S. Cl. ............................ 365/185.17; 365/185.05; 365/185.11; 365/63; 365/185.28

(58) Field of Classification Search ............ 365/185.17, 365/185.05, 185.11, 63, 185.26
See application file for complete search history.

(56) References Cited

U.S. PATENT DOCUMENTS

| 5,023,680 | A | * | 6/1991 | Gill et al. ..................... 257/317 |
| 5,025,494 | A | * | 6/1991 | Gill et al. ..................... 257/316 |
| 5,043,940 | A | | 8/1991 | Harari |
| 5,095,344 | A | | 3/1992 | Harari |
| 5,159,570 | A | * | 10/1992 | Mitchell et al. ........ 365/185.03 |
| 5,172,338 | A | | 12/1992 | Mehrotra et al. |

(Continued)

FOREIGN PATENT DOCUMENTS

EP 0373698 A2 12/1989

(Continued)

OTHER PUBLICATIONS

"Twin MONOS Cell with Dual Control Gates" by Yutaka Hayashi et al., 2000 Symposium on VLSI Technology Digest of Technical Papers, pp. 122-123.

(Continued)

*Primary Examiner*—Viet Q Nguyen
(74) *Attorney, Agent, or Firm*—Davis Wright Tremaine LLP

(57) ABSTRACT

A flash NAND type EEPROM system with individual ones of an array of charge storage elements, such as floating gates, being capacitively coupled with at least two control gate lines. The control gate lines are preferably positioned between floating gates to be coupled with sidewalls of floating gates. The memory cell coupling ratio is desirably increased, as a result. Both control gate lines on opposite sides of a selected row of floating gates are usually raised to the same voltage while the second control gate lines coupled to unselected rows of floating gates immediately adjacent and on opposite sides of the selected row are kept low. The control gate lines can also be capacitively coupled with the substrate in order to selectively raise its voltage in the region of selected floating gates. The length of the floating gates and the thicknesses of the control gate lines can be made less than the minimum resolution element of the process by forming an etch mask of spacers.

13 Claims, 12 Drawing Sheets

U.S. PATENT DOCUMENTS

| | | | |
|---|---|---|---|
| 5,229,632 A * | 7/1993 | Yoshikawa | 257/320 |
| 5,343,063 A | 8/1994 | Yuan et al. | |
| 5,422,504 A * | 6/1995 | Chang et al. | 365/185.15 |
| 5,483,487 A * | 1/1996 | Sung-Mu | 365/185.33 |
| 5,570,315 A | 10/1996 | Tanaka et al. | |
| 5,677,872 A | 10/1997 | Samachisa et al. | |
| 5,736,443 A | 4/1998 | Park et al. | |
| 5,774,397 A | 6/1998 | Endoh et al. | |
| 5,877,980 A | 3/1999 | Mang et al. | |
| 5,887,145 A | 3/1999 | Harari et al. | |
| 5,936,274 A * | 8/1999 | Forbes et al. | 257/315 |
| 5,936,887 A | 8/1999 | Choi et al. | |
| 5,943,267 A * | 8/1999 | Sekariapuram et al. | 365/185.28 |
| 5,973,352 A | 10/1999 | Noble | |
| 5,990,514 A | 11/1999 | Choi et al. | |
| 6,013,551 A | 1/2000 | Chen et al. | |
| 6,044,017 A | 3/2000 | Lee et al. | |
| 6,046,935 A | 4/2000 | Takeuchi et al. | |
| 6,069,382 A | 5/2000 | Rahim | |
| 6,091,102 A * | 7/2000 | Sekariapuram et al. | 257/316 |
| 6,091,104 A | 7/2000 | Chen | |
| 6,093,605 A | 7/2000 | Mang et al. | |
| 6,103,573 A | 8/2000 | Harari et al. | |
| 6,108,239 A | 8/2000 | Sekariapuram et al. | |
| 6,127,696 A | 10/2000 | Sery et al. | |
| 6,133,098 A | 10/2000 | Ogura et al. | |
| 6,214,665 B1 | 4/2001 | Sakui | |
| 6,222,227 B1 * | 4/2001 | Chen | 257/316 |
| 6,246,607 B1 | 6/2001 | Mang et al. | |
| 6,291,297 B1 | 9/2001 | Chen | |
| 6,411,548 B1 | 6/2002 | Sakui et al. | |
| 6,455,889 B2 | 9/2002 | Sakui | |
| 6,472,707 B1 | 10/2002 | Takahashi | |
| 6,512,263 B1 | 1/2003 | Yuan et al. | |
| 6,541,815 B1 | 4/2003 | Mandelman et al. | |
| 6,563,728 B2 | 5/2003 | Kobayashi | |
| 6,570,214 B1 | 5/2003 | Wu | |
| 6,580,120 B2 | 6/2003 | Haspeslagh | |
| 6,703,298 B2 | 3/2004 | Roizin et al. | |
| 6,762,092 B2 | 7/2004 | Yuan et al. | |
| 6,807,105 B2 * | 10/2004 | Ogura et al. | 365/185.28 |
| 6,853,028 B2 * | 2/2005 | Kim et al. | 257/315 |
| 6,859,394 B2 | 2/2005 | Matsunaga et al. | |
| 6,888,755 B2 | 5/2005 | Harari | |
| 6,894,339 B2 | 5/2005 | Fan et al. | |
| 6,894,930 B2 | 5/2005 | Chien et al. | |
| 6,898,121 B2 | 5/2005 | Chien et al. | |
| 6,925,007 B2 | 8/2005 | Harari et al. | |
| 6,936,887 B2 * | 8/2005 | Harari et al. | 257/319 |
| 6,992,929 B2 * | 1/2006 | Chen et al. | 365/185.17 |
| 7,038,291 B2 | 5/2006 | Goda et al. | |
| 7,049,652 B2 | 5/2006 | Mokhlesi et al. | |
| 7,075,823 B2 * | 7/2006 | Harari | 365/185.17 |
| 7,303,956 B2 | 12/2007 | Harari | |
| 7,341,918 B2 | 3/2008 | Harari et al. | |
| 2002/0014645 A1 | 2/2002 | Kobayashi | |
| 2002/0102774 A1 | 8/2002 | Kao et al. | |
| 2003/0006450 A1 | 1/2003 | Haspeslagh | |
| 2003/0032241 A1 | 2/2003 | Seo et al. | |
| 2003/0047774 A1 * | 3/2003 | Sugita et al. | 257/314 |
| 2003/0109093 A1 | 6/2003 | Harari et al. | |
| 2003/0155599 A1 | 8/2003 | Hsu et al. | |
| 2003/0227811 A1 | 12/2003 | Sugiura et al. | |
| 2003/0232472 A1 | 12/2003 | Wu | |
| 2004/0021171 A1 | 2/2004 | Nishizaka | |
| 2004/0079988 A1 * | 4/2004 | Harari | 257/316 |
| 2004/0165443 A1 * | 8/2004 | Harari | 365/185.18 |
| 2006/0040052 A1 | 2/2006 | Fang et al. | |
| 2006/0187714 A1 | 8/2006 | Harari | |
| 2006/0202256 A1 | 9/2006 | Harari | |
| 2006/0231885 A1 | 10/2006 | Lee | |
| 2006/0291281 A1 | 12/2006 | Wang et al. | |
| 2007/0243680 A1 | 10/2007 | Harari et al. | |

FOREIGN PATENT DOCUMENTS

| | | | |
|---|---|---|---|
| EP | 1265289 A2 | 12/2002 | |
| EP | 1289023 A2 | 3/2003 | |
| JP | 360117783 A * | 6/1985 | |
| JP | 06037328 | 2/1994 | |
| JP | H10-144807 A | 5/1998 | |
| JP | 20001083192 A | 6/2000 | |
| JP | 20010110917 A | 4/2001 | |

OTHER PUBLICATIONS

"Notification of Transmittal of the International Search Report or the Declaration", corresponding PCT application No. PCT/US03/32383, International Searching Authority, European Patent Office, Mar. 24, 2004, 9 pages.

Suh et al., "A 3.3V 32Mb NAND Flash Memory With Incremental Step Pulse Programming Scheme," IEEE International Solid-State Circuits Conference, Digest of Technical Papers, Feb. 1995, pp. 94-95, 305-306, 128-129 and 350.

Chan et al., "A True Single-Transistor Oxide-Nitride-Oxide EEPROM Device", IEEE Electron Device Letters, vol. EDL-8, No. 3, Mar. 1987, pp. 93-95.

Nozaki et al., "A 1-Mb EEPROM With MONOS Memory Cell for Semiconductor Disk Application", IEEE Journal of Solid-State Circuits, vol. 26, No. 4, Apr. 1991, pp. 497-501.

Choi et al., "A Novel Booster Plate Technology in High Density NAND Flash Memories for Voltage Scaling-Down and Zero Program Disturbance", IEEE Symposium on VLSI Technology Digest of Technical Papers, 1996, pp. 238-239.

Kim et al., "Fast Parallel Programming of Multi-Level NAND Flash Memory Cells Using the Booster-Line Technology", Symposium on VLSI Technology Digest of Technical Papers, 1997, pp. 65-66.

Choi et al, "A Triple Polysilicon Stacked Flash Memory Cell With Wordline Self-Boosting Programming", IEEE, 1997, pp. 283-286.

Satoh et al., "A Novel Channel Boost Capacitance (CBC) Cell Technology with Low Program Disturbance Suitable for Fast Programming 4Gbit NAND Flash Memories", IEEE Symposium on VLSI Technology Digest of Technical Papers, 1998, pp. 108-109.

Hsu, Cheng-Yuan et al., "Split-Gate NAND Flash Memory at 120nm Technology Node Featuring Fast Programming and Erase," IEEE 2004 Symposium on VLSI Technology Digest of Technical Papers, Jul. 2004, pp. 78-79.

Wolf, PhD., Stanley, "*Silicon Processing for the VLSI Era, vol. 4-Deep-Submicron Process Technology*," Lattice Press, 2002, pp. 1-806.

EPO, "Office Action," corresponding European Patent Application No. 03770742.9, dated Jun. 11, 2007, 6 pages.

USPTO, "Notice of Allowance and Fee(s) Due," mailed in related U.S. Appl. No. 11/379,012 on Aug. 10, 2007, 14 pages.

USPTO, "Office Action," for U.S. Appl. No. 11/379,019 mailed Apr. 30, 2008, 16 pages.

The China State Intellectual Property Office, "Office Action," corresponding Chinese Patent Application No. 200380104733.X, mailed on Oct. 10, 2008, 3 pages. (translation only).

USPTO, "Notice of Allowance and Fee(s) Due," mailed in related U.S. Appl. No. 11/379,019 on Sep. 8, 2008, 12 pages.

Wolf, "Silicon Processing for the VLSI Era, vol. 1-Process Technology," Second Edition, copyright 2000, pp. 666-667, p. 742.

* cited by examiner

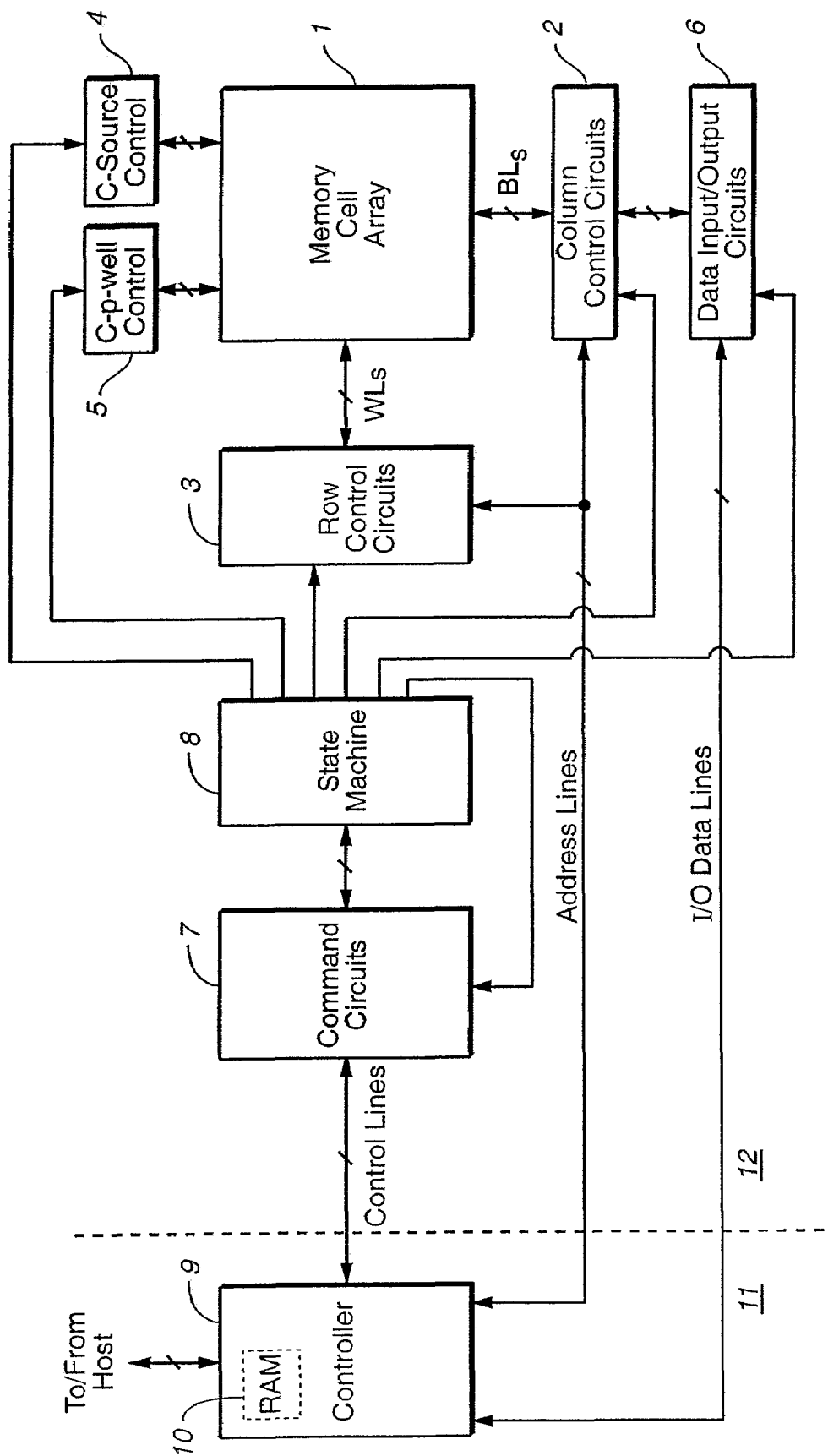
FIG._1

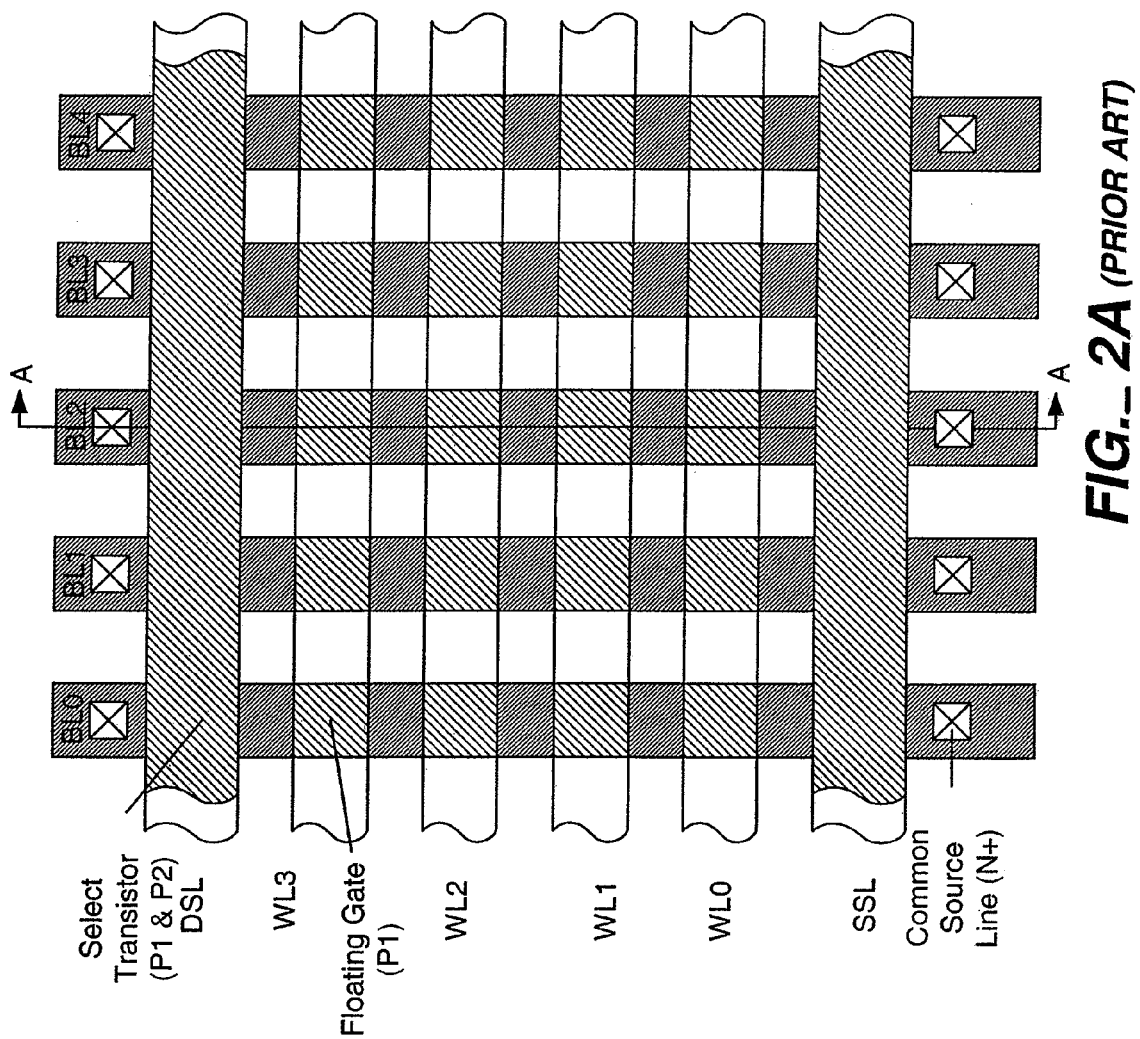
FIG._2A (PRIOR ART)

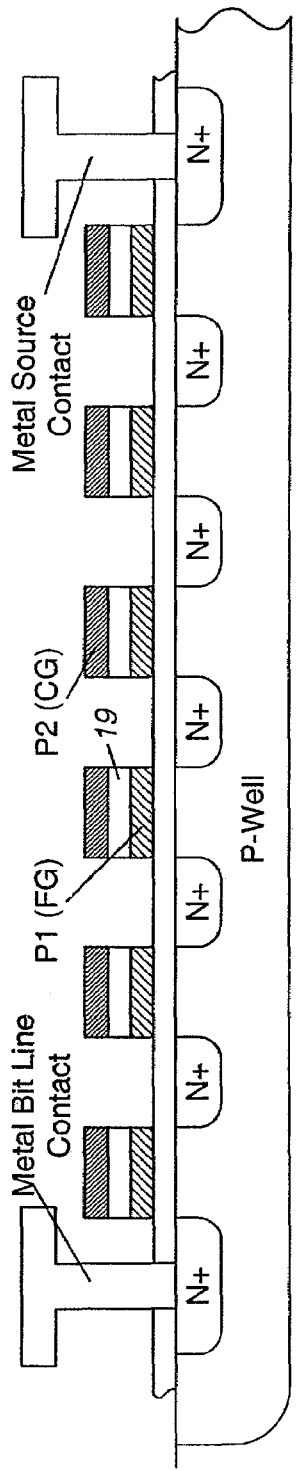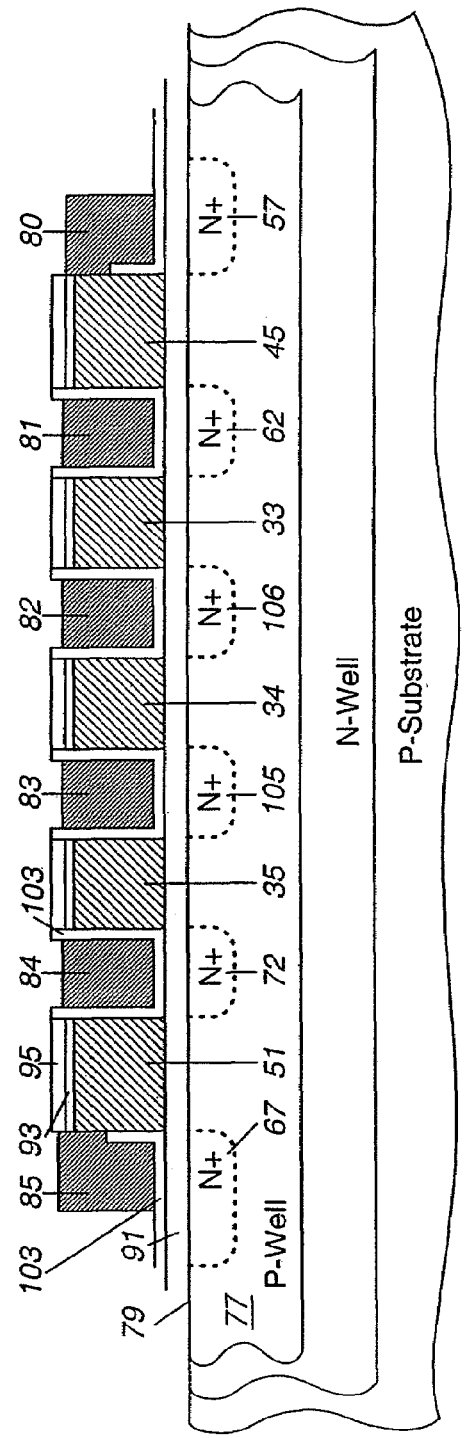

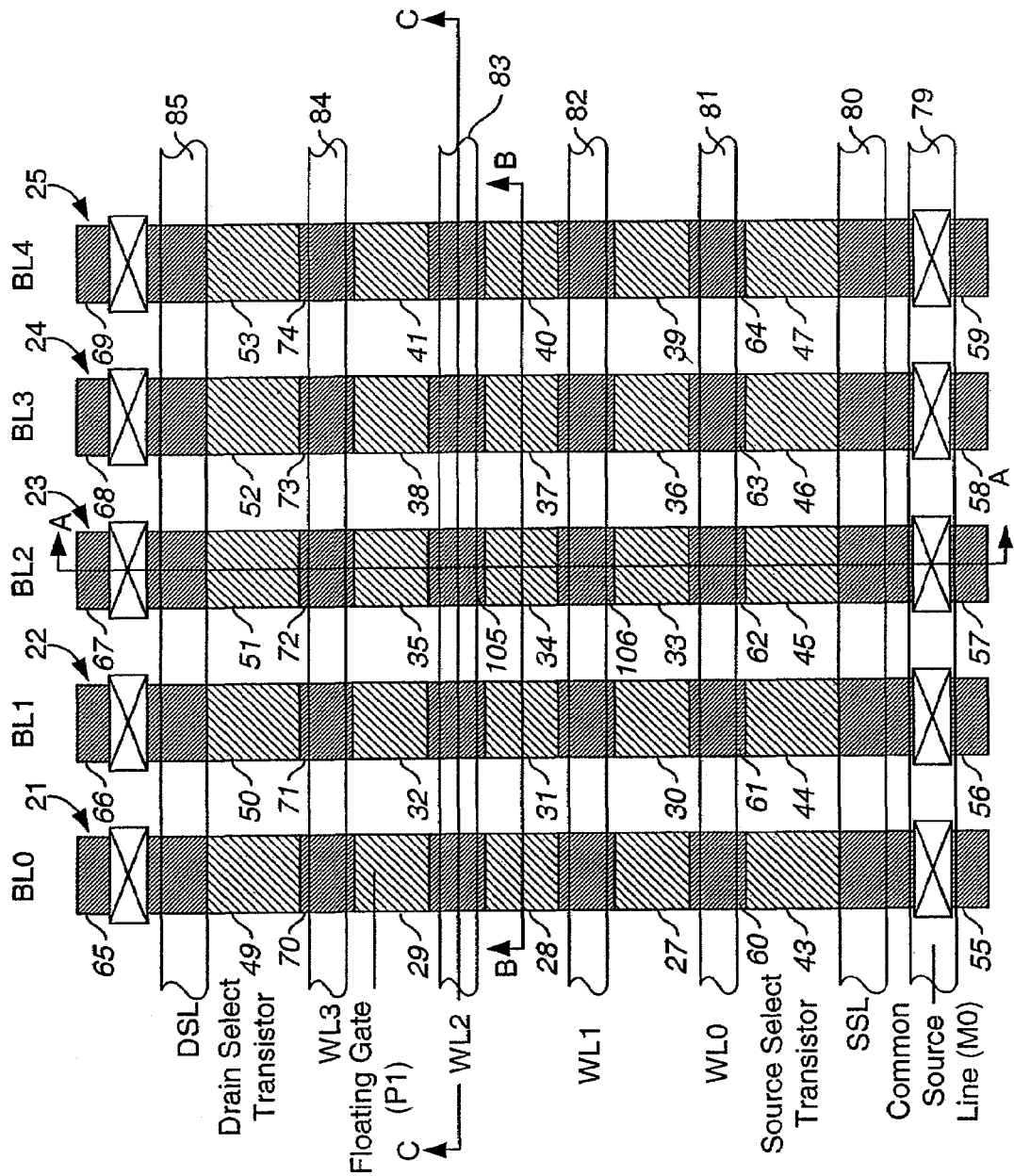
FIG._3

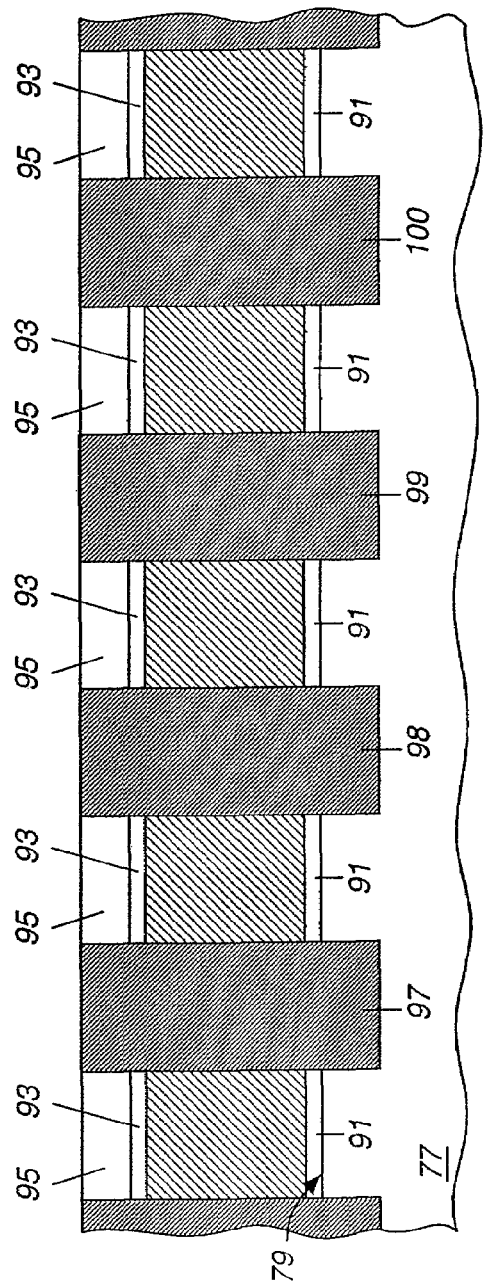
FIG._5A
(Section B-B)
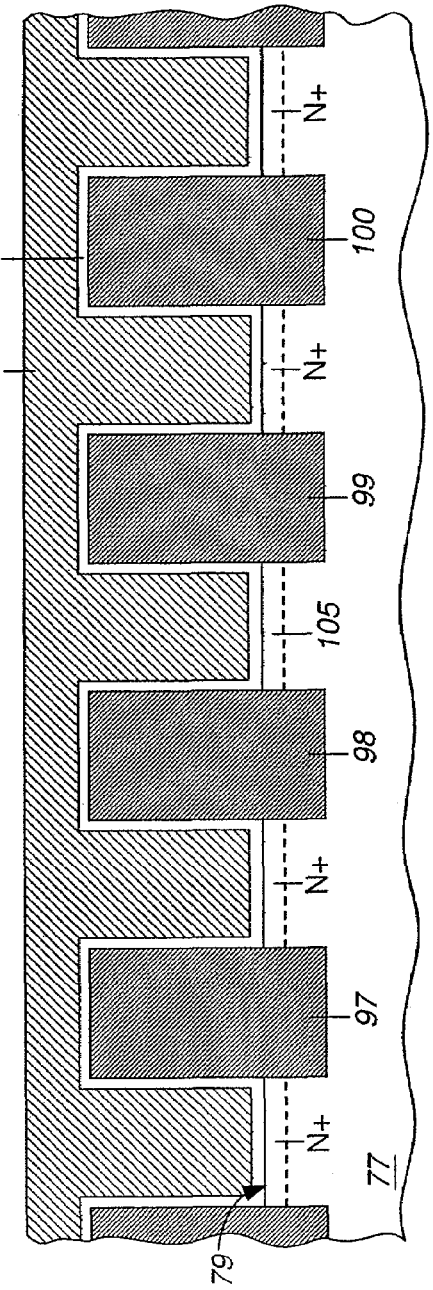
FIG._5B
(Section C-C)

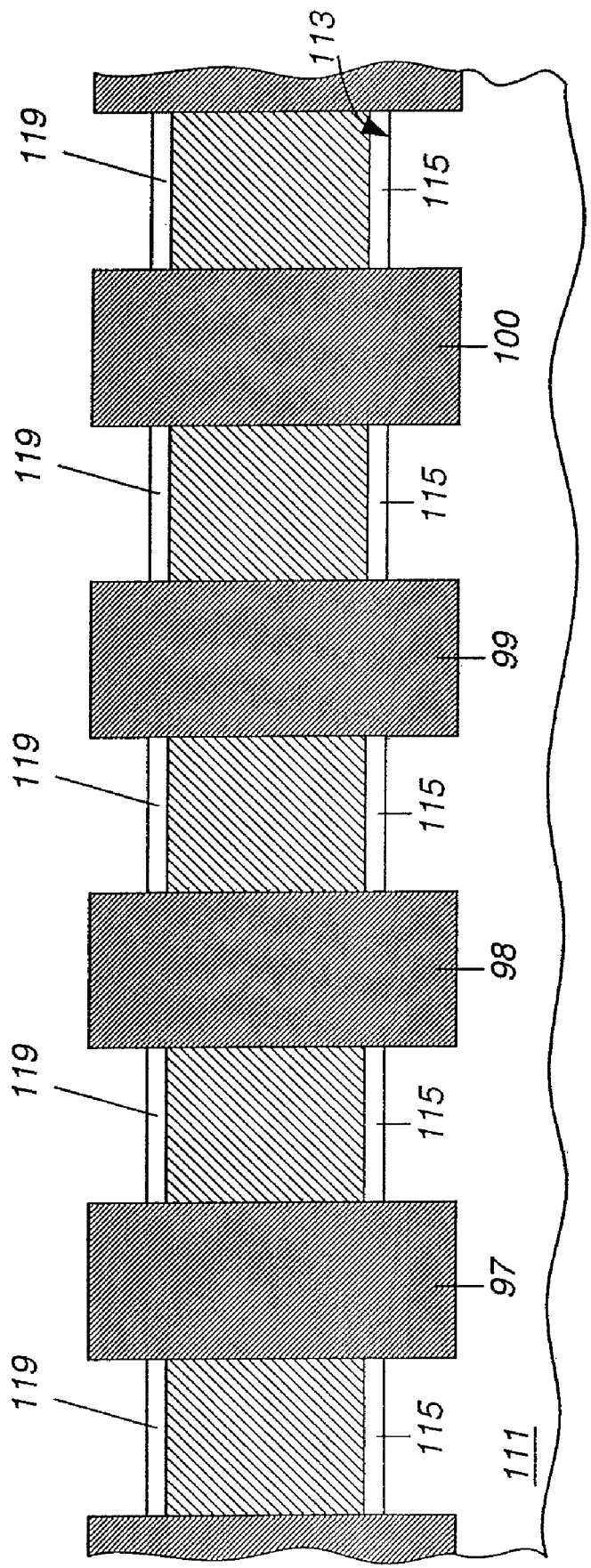
FIG._6
(Section B-B)

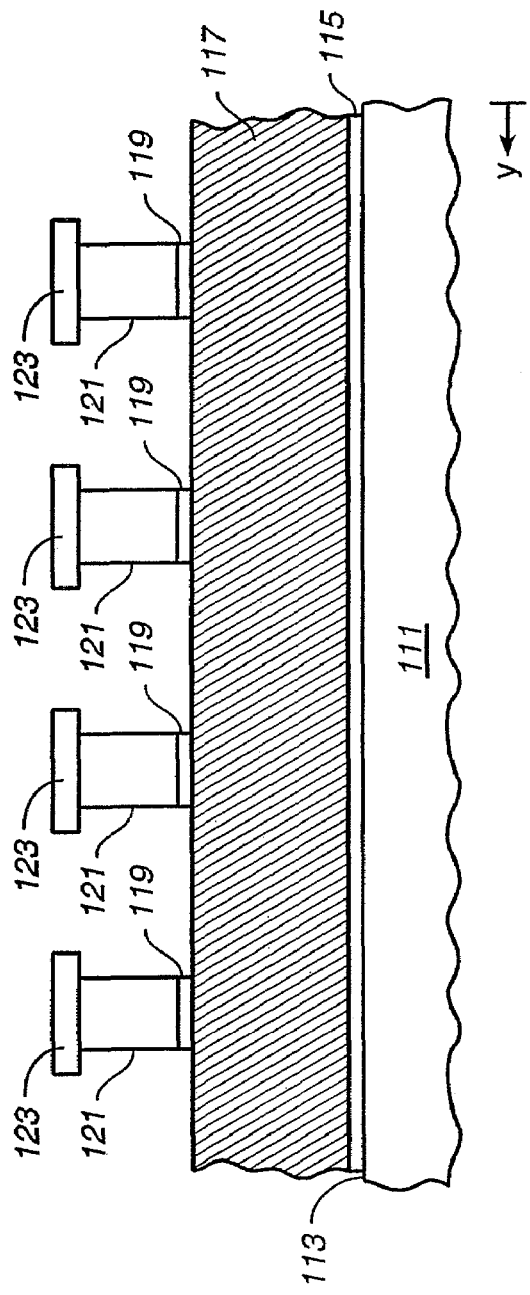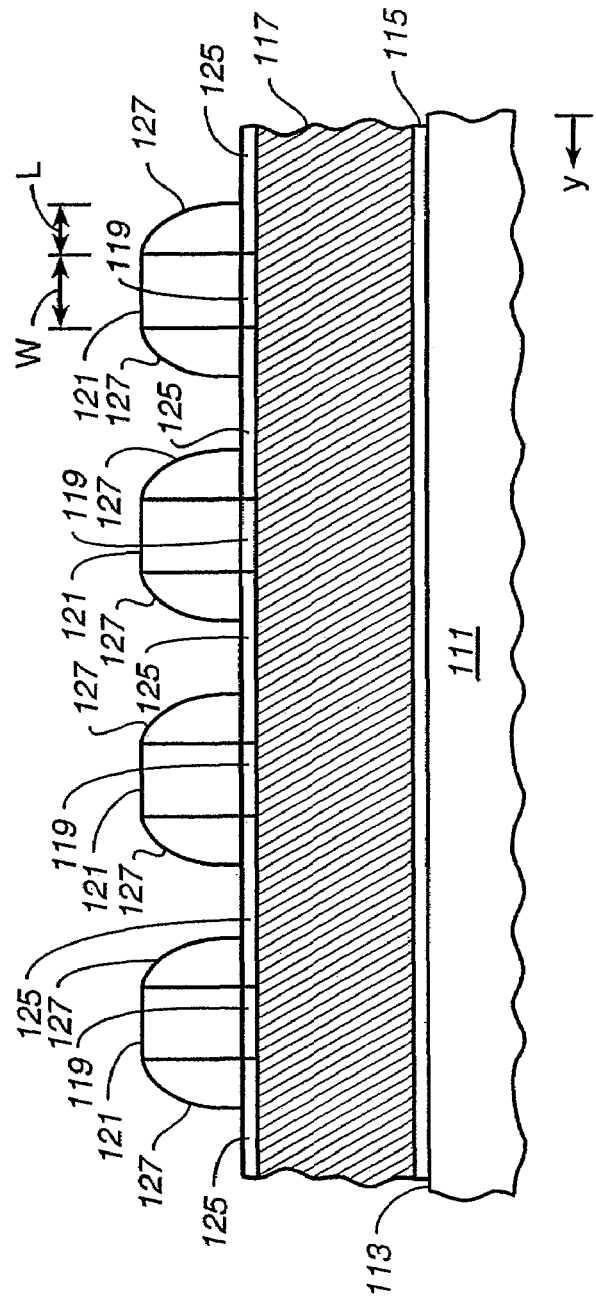

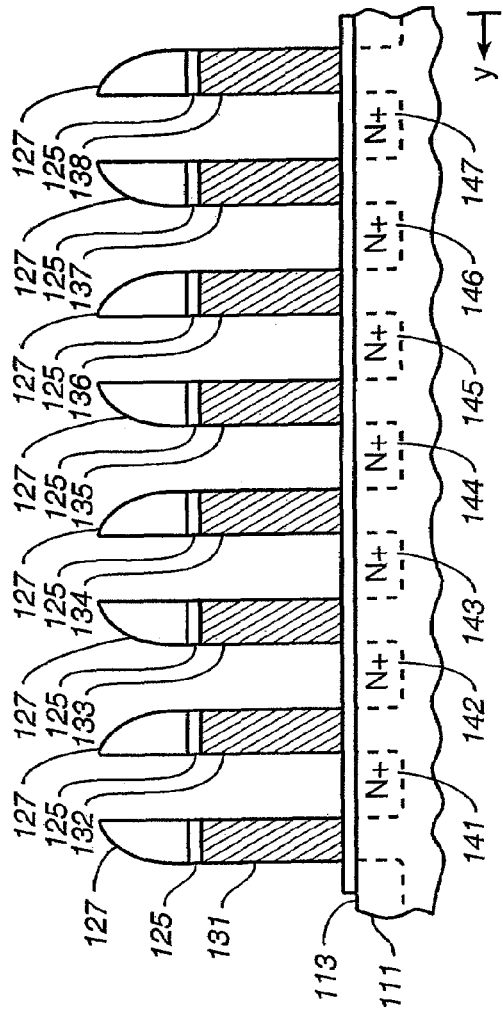
FIG._9
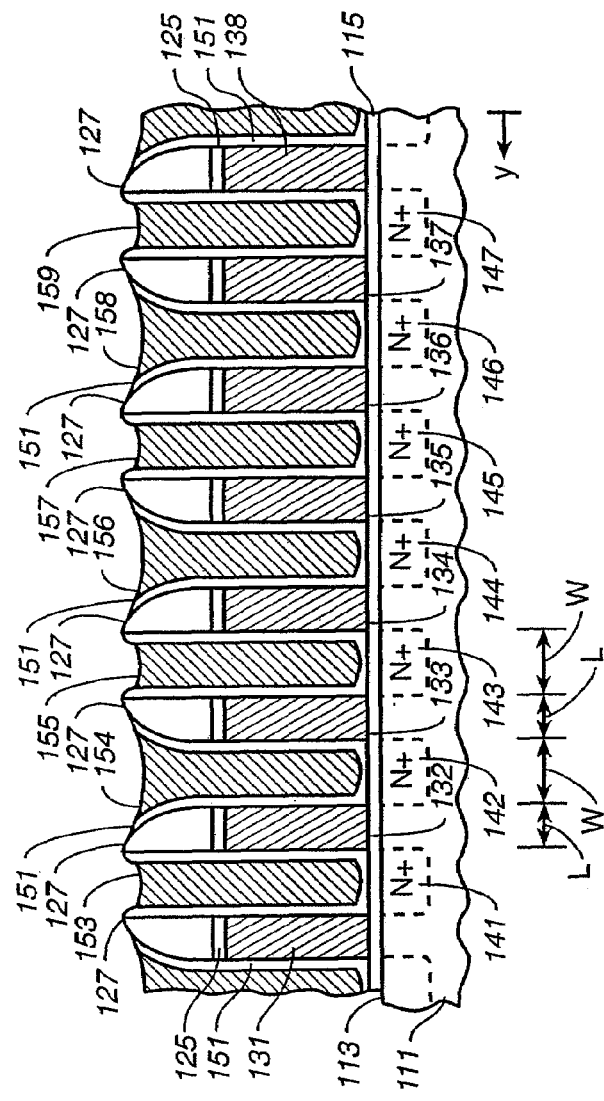
FIG._10

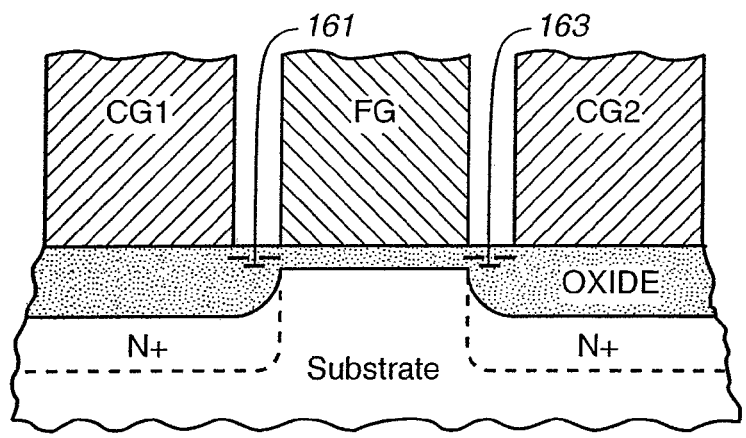
FIG._11
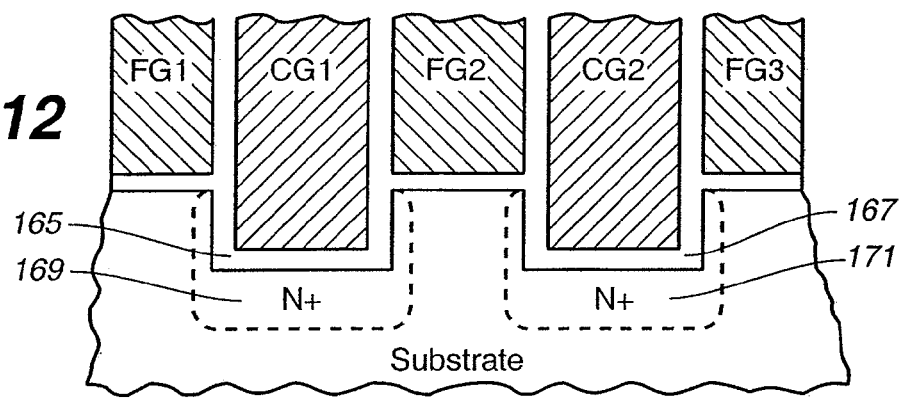
FIG._12
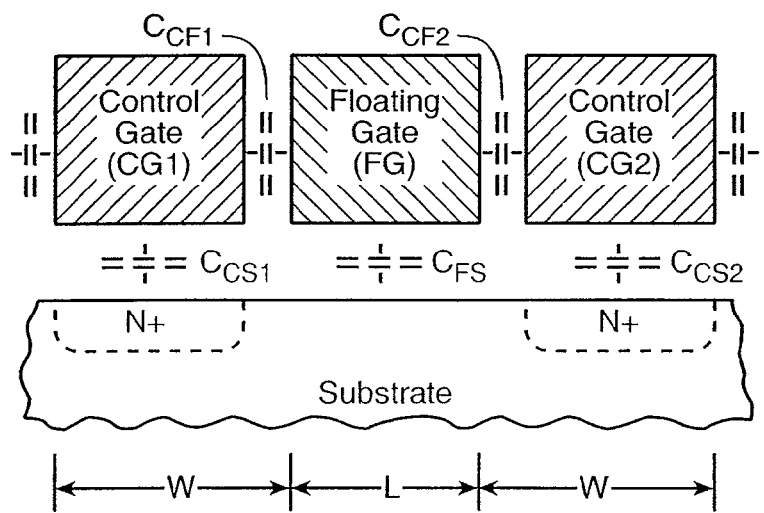
FIG._13

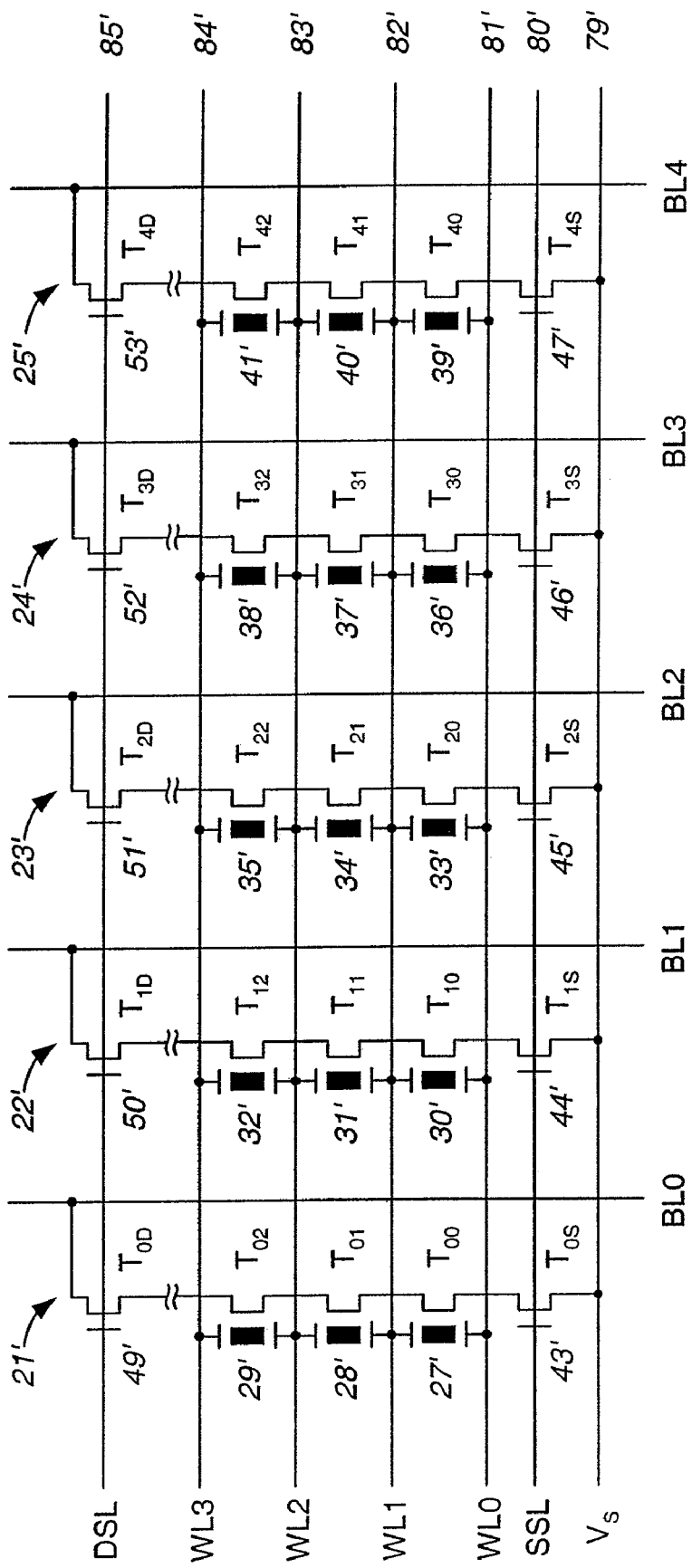
FIG._14

|  | Erase | Program | Read |
|---|---|---|---|
| $V_D$ (bit lines) | Float | Program: 0v<br>Pgm Inhibit: ~2v | sensed |
| $V_{SSL}$ | Float | ~2v | ~5v |
| $V_S$ | Float | 0 v, Float,<br>or slight positive | 0v |
| P-Well | ~16v | 0 v | 0v |
| $V_{CG}$:<br>(all control gates) | 0v – selected block<br>Float - unselected | - | - |
| Selected cell<br>(both gates) |  | ~13 – 20 v<br>stepped | 0 – 5 v<br>stepped |
| All unselected cells<br>(above selected cell) |  | ~2v | ~5v (1) |
| All unselected cells<br>(below selected cell) |  | ~0v | ~5v (1) |

*FIG._15*

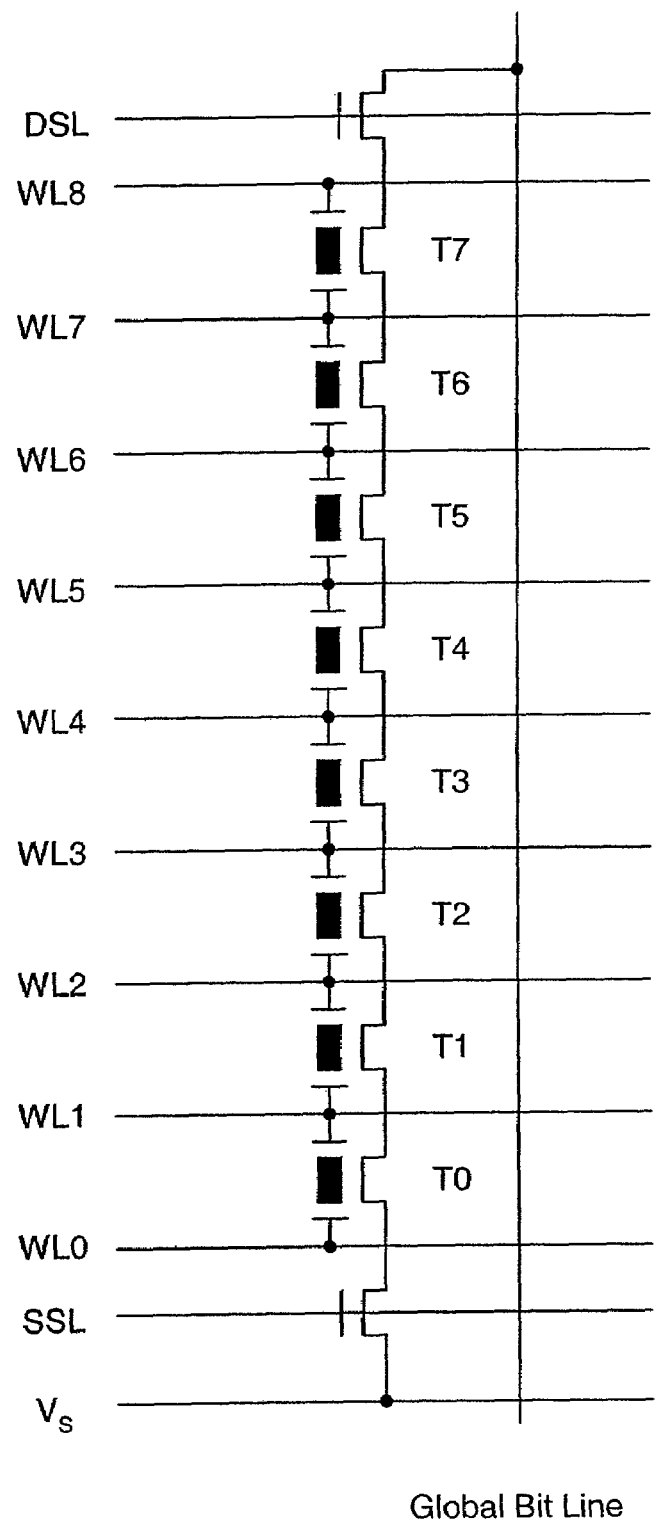
FIG._16

FLASH MEMORY CELL ARRAYS HAVING DUAL CONTROL GATES PER MEMORY CELL CHARGE STORAGE ELEMENT

CROSS REFERENCE TO RELATED APPLICATION

This is a divisional of application Ser. No. 10/791,486, filed Mar. 1, 2004, now U.S. Pat. No. 7,075,823 which in turn is a divisional of application Ser. No. 10/282,747, filed Oct. 28, 2002, now U.S. Pat. No. 6,888,755, which applications are incorporated herein in their entirety by this reference.

FIELD OF THE INVENTION

This invention relates generally to non-volatile semiconductor memories of the flash EEPROM (Electrically Erasable and Programmable Read Only Memory) type, particularly to structures and methods of operating NAND types of memory cell arrays.

BACKGROUND OF THE INVENTION

There are many commercially successful non-volatile memory products being used today, particularly in the form of small form factor cards, which use an array of flash EEPROM cells.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates, often in polysilicon (labeled P2 in FIG. 2B, a cross-section along line A-A of FIG. 2A). The control gate lines are typically formed over the floating gates as a self-aligned stack, and are capacitively coupled with each other through an intermediate dielectric layer 19, as shown in FIG. 2B. The top and bottom of the string connect to the bit line and a common source line respectively, commonly through a transistor using the floating gate material (P1) as its active gate electrically driven from the periphery. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parrallel, thereby to read charge level states along a row of floating gates in parallel. Examples of NAND memory cell array architectures and their operation as part of a memory system are found in U.S. Pat. Nos. 5,570,315, 5,774,397 and 6,046,935.

The charge storage elements of current flash EEPROM arrays are most commonly electrically conductive floating gates, typically formed from doped polysilicon material.

Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, a page defined as the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As in most all integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell charge storage element. This is accomplished by dividing a window of a storage element charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338.

The patents and articles identified above are all hereby expressly incorporated in their entirety into this Background by these references.

SUMMARY OF THE INVENTION

A significant limitation on the continued shrinking of the size of current non-volatile memory cell arrays is the floating gate dielectric. This cannot practically be made thinner than the approximately 70 Angstrom (7 nm) minimum thickness currently being used without resulting in leakage and difficulties in long term data retention. This means that the voltages required to be coupled to the floating gates to control conduction in the memory cell channels below them cannot be reduced as the size of the various gates and distances between them are reduced. Undesired coupling of voltages between the various gates increases as the distance between them decreases unless a compensating reduction in the voltage levels being used can be made. It is important that such a reduction be made if future scaling of memory arrays is to be made.

A reduction in the level of the control gate voltages is made possible if the coupling ratio of the floating gate can be increased. The coupling ratio is equal to the capacitance between the floating and control gates, divided by the capacitance between the floating gate and all adjacent electrodes, most specifically the substrate, as is well known. The values of these capacitances depend upon the size of the opposing surface areas that are coupled, and the thickness and dielectric constants of the dielectric layers between them. Reduction of the coupling ratio is difficult to achieve in NAND arrays because of their stacked control and floating gate structures. When the coupling area of the floating gate with the substrate is made smaller as part of a shrink, which as a denominator could result in an increase in the coupling ratio, the coupling area between the floating gate and the control gate is similarly reduced, which causes the numerator to decrease as well.

Another undesired effect of scaling is an increase in parasitic capacitances between conductive array elements, particularly between adjacent floating gates. Errors in programming or in reading the state of one floating gate can, for example, be caused by the close proximity of the charge stored on the floating gate of an adjacent cell. This coupling can create a significant number of errors in multi-state operation where the allowed range of threshold voltages of the floating gate transistor that is devoted to each state is very small.

According to one primary aspect of the present invention, the memory cell array floating gates are individually coupled with at least two control gates, thereby to increase the total coupling area between floating and control gates without increasing the coupling area between the floating gate and the substrate, thus increasing the coupling ratio. In a NAND array, the control gates usually stacked on top of rows of floating gates are replaced by control gates positioned between the floating gates along the memory cell strings. The individual floating gates are then capacitively coupled through opposing sidewalls to two control gates, one on each side. The height of the floating gates is increased to increase the coupling area with these control gates. The total coupling area of an individual floating gate with the control gates is significantly increased independent of the coupling area between the floating gate and the substrate. This allows the control gate voltages to be significantly reduced but still results in increasing the voltage coupled to the floating gates to the values now used to control the memory cell channel through the gate dielectric having a given thickness.

In operation, the voltage of one row of floating gates is increased during their programming or reading by raising the voltage on the control gates on both sides of the row. A similar voltage rise of floating gates in adjacent rows is reduced, even though they are also coupled with one of these control gates whose voltage has been increased, by keeping the voltage low on control gates coupled with opposite sides of these adjacent rows of floating gates.

The positioning of control gates between floating gates along NAND memory cell strings also reduces the undesirable coupling between floating gates of adjacent cells because the electrically driven control gates tend to shield the electric field between the floating gates. Further, the control gates can be capacitively coupled to areas of the substrate between floating gates in order to boost the voltage of the substrate for certain operations such as inhibiting the programming of individual cells.

According to another primary aspect of the present invention, channel lengths of the individual transistors in the NAND strings having a given number of floating gate storage elements are significantly reduced, up to almost one-half existing lengths, by forming the floating gates using spacers having a dimension significantly less that the minimum resolution element size of the lithography being used in the process. Such spacers are formed over a layer of doped polysilicon or other conductive material, for example, of a first dielectric material along sides of strips of a second dielectric material. Once the second dielectric material is removed, the spacers of the first dielectric material form a mask through which the underlying conductive floating gate material is etched. The size of the floating gates and the spaces between them are reduced. The control gates are preferably provided between the smaller floating gates and operated in the same manner as described above. Smaller NAND memory cell strings result in more of them being formed in a given area, and a resulting increase in the density of data storage in a given size of memory cell array.

Additional aspects, advantages and features of the present invention are included in the following description of exemplary examples thereof, which description should be taken in conjunction with the accompanying drawings.

BRIEF DESCRIPTION OF THE DRAWINGS

FIG. 1 is a block diagram of a type of memory system in which the memory cell array and operational improvements of the present invention may be implemented;

FIG. 2A is a plan view of a prior art NAND array;

FIG. 2B is a cross-sectional view of the prior art NAND array of FIG. 2A taken along the line A-A;

FIG. 3 is a plan view of an example memory cell array in a NAND configuration;

FIG. 4 is a cross-sectional view of the array of FIG. 3, taken at section A-A thereof;

FIG. 5A is a cross-sectional view of the array of FIG. 3, taken at section B-B thereof;

FIG. 5B is a cross-sectional view of the array of FIG. 3, taken at section C-C thereof;

FIG. 6 is a cross-sectional view of a modified version of the array of FIGS. 3-5, taken at section B-B, at a corresponding process stage to FIG. 5A of the first embodiment.

FIGS. 7-10 are cross-section views of sequentially formed structures of a second embodiment of the array of FIGS. 3-5, taken at section A-A of FIG. 3;

FIG. 11 is an enlarged cross-sectional view of a memory cell of either of the embodiments of FIGS. 3-5 or 7-10, to illustrate an advantage thereof;

FIG. 12 is a cross-sectional view of an alternate memory cell construction that may be implemented in either of the embodiments of FIGS. 3-5 or 7-10;

FIG. 13 illustrates the capacitive coupling between gate elements and the substrate of either of the embodiments of FIGS. 3-5 or 7-10;

FIG. 14 is an equivalent circuit diagram of a memory cell array according to either of the embodiments of FIGS. 3-5 or 7-10;

FIG. 15 is a table of example memory cell array operating conditions that reference the circuit diagram of FIG. 14; and FIG. 16 is a circuit diagram of one NAND string used for illustration of methods of reading the NAND memory.

DETAILED DESCRIPTION OF EXEMPLARY EMBODIMENTS

Memory System

An example memory system in which the various aspects of the present invention may be implemented is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type that is described above in the Background and in references incorporated herein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

Command data for controlling the flash memory device are inputted to command circuits 7 connected to external control lines that are connected with the controller 9. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 9 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 11 that includes the controller 9, and one or more integrated circuit chips 12 that each contain a memory array and associated control, input/output and state machine circuits. The trend, of course, is to integrate the memory array and controller circuits of a system together on one or more integrated circuit chips.

The memory system of FIG. 1 may be embedded as part of the host system, or may be included in a memory card that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145, which patent is expressly incorporated herein in its entirety by this reference.

First NAND Array Embodiment

Major components of a few memory cells of a NAND array are illustrated in plan view in FIG. 3, with an equivalent circuit thereof shown in FIG. 14 where corresponding elements are indicated by the same reference number as in FIG. 3 but with a prime (') added. Five strings 21-25 of series connected memory cells are included, with three floating gate charge storage elements shown in each string. The string 21 includes floating gates 27, 28 and 29, the string 22 has floating gates 30, 31 and 32, the string 23 includes floating gates 33, 34 and 35, the string 24 has floating gates 36, 37 and 38, and the string 25 includes floating gates 39, 40 and 41. Only a small rectangular array of fifteen memory cells is illustrated for ease of explanation. Actual implementations of such an array include millions of such memory cells in thousands of NAND strings, each string normally having 16, 32 or more memory cells. It is understood that the memory array is typically positioned over one or more well regions contained within a common substrate in order to allow the local substrate potential of the memory array to be electrically controlled independent of the common substrate potential. The use of the term "substrate" with respect to a memory array of transistors throughout this description will include reference to such well regions unless specifically noted.

Each of the NAND strings 21-25 includes two select transistors, one at each end of the string, to controllably connect the string between a different one of global bit lines BL0-BL4 (FIG. 14) and a reference potential $V_S$. $V_S$ is normally ground during read but may assume a small positive value during programming to assist in minimizing leakage across the source select transistor. Voltage $V_{SSL}$ is applied to respective gates 43-47 of select transistors $T_{0S}$-$T_{4S}$ control connection of one end of their respective memory cell strings 21-25 to $V_S$. The other ends of the strings 21-25 are connected through respective select transistors $T_{0D}$-$T_{4D}$ (FIG. 14) to the respective bit lines BL0-BL4 by voltage $V_{DSL}$ applied to select transistor gates 49-53. The column control circuits 2 (FIG. 1) apply a voltage to each bit line that is representative of the specific data to be written, or sense the voltage or current during a read operation. The select transistors $T_{0S}$-$T_{4S}$ and $T_{0D}$-$T_{4D}$ (FIG. 14) include respective source and drain regions 55-64 and 65-74 (FIG. 3) in a semiconductor substrate 77 at its surface 79 (FIGS. 4, 5A and 5B).

A typical prior art NAND array includes control gate (word) lines extending across multiple strings over rows of floating gates with a suitable insulating dielectric layer therebetween. Close coupling between the control and floating gates is desirable, as discussed above, in order to minimize the control gate voltages that are required to raise the coupled floating gates to the voltage levels necessary for programming and reading their states. One control gate (word) line is used for each row of floating gates. In order to make an array with the floating and control gates self-aligned in a y-direction (along the lengths of the NAND strings), the control gates are typically used as masks to form the floating gates, which then have the same dimensions in the y-direction as the control gates. There are limited opportunities with this architecture to increase the area of coupling between the control and floating gates in order to increase the coupling ratio discussed above in order to enable operation with lower control gate voltages appropriate to future scaled technologies.

Therefore, in the NAND array shown in FIGS. 3-5, control gate (word) lines 81-84 are positioned between the floating gates instead of on top of them. Each of the control gate lines extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independently of the coupling area of the floating gates and the substrate, resulting in a desirably high coupling ratio even as the coupling area of the floating gates with the substrate is reduced during future shrinks.

Two of these control gate lines replace a single word line of conventional prior art NAND arrays. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

A method of forming the array of FIG. 3, and additional features of the array, can be explained by reference primarily to the orthogonal cross-section views of FIG. 4 (line A-A in the y-direction of FIG. 3 through one string of memory cells), FIG. 5A (line B-B in the x-direction of FIG. 3 along a row of memory cells extending across multiple strings), and FIG. 5B (line C-C in the x-direction of FIG. 3 along a word line). After doping of the substrate 77, typically including formation of one or more wells, a layer 91 of tunnel silicon oxide ($SiO_2$) is grown on the surface 79 of the substrate 77 to a thickness of about 8 nm. A first layer of doped polysilicon is then formed over at least the area of the array, typically by low-pressure chemical vapor deposition (LPCVD), to a thickness of from 50 to 200 nm. from which the floating gates are later formed. This is thicker than the usual first polysilicon layer in prior art NAND devices, with the result that the later formed floating gates are thicker than previously. A thin pad 93 of silicon dioxide is then formed over the top of the polysilicon layer, followed by depositing a layer 95 of silicon nitride ($Si_3N_4$) of thickness typically between 100 and 300 nm. A mask is then formed on the top of the nitride layer for etching the exposed Nitride, oxide pad, polysilicon and tunnel oxide to leave stacked strips elongated across the substrate in the y-direction and separated in the x-direction by the smallest spacing dimension resolvable by the mask formation process. The width of these strips is also preferably made equal to their spacing. The etch is anisotropic and exposes the surface 79 of the substrate 77 between these strips.

A next series of steps provides electrical isolation between resulting columns of floating gates by Shallow Trench Isolation (STI). The exposed substrate surface is then anisotropically etched to form trenches 97-100 (FIG. 5A) elongated in the y-direction and positioned between the polysilicon/dielectric stack strips in the x-direction. These trenches are preferably etched to a depth of 100-300 nm. The exposed silicon surface region may be implanted with a light Boron dose to locally increase the field oxide threshold voltage if needed. A thick oxide layer is then deposited over the entire array area to completely fill these trenches and the spaces between the polysilicon/dielectric stacked strips. Excess oxide above the stacked strips is then removed by Chemical Mechanical Polishing (CMP), down to the nitride layer 95 used as a stop. A relatively flat surface then exists across the tops of the nitride strips 95 and thick oxide (regions 97-100 in FIG. 5A). As is well known in the art, high temperature annealing may be employed to relieve the mechanical stress in the silicon isolation trenches as well as to densify the thick oxide in these trenches. It is also possible to form the array without employing shallow trench isolation, for example by forming thick dielectric isolation above the silicon surface rather than in trenches etched into it.

In a next step, a mask is formed with strips extending in the x-direction, perpendicular to the polysilicon/dielectric strips just formed, between which the polysilicon/dielectric strips are removed down to the tunnel dielectric layer 91 by an anisotropic etch. The sum of the width of the strips of the mask and the spaces between them are made to be as small as possible, the pitch of the process. The actual mask may be photoresist over another deposited layer of nitride or oxide that is masked and etched to form the masking strips in the x-direction, followed by etching the thus exposed underlying first polysilicon layer and a portion of the exposed field oxide regions. This separates the remaining strips of the first polysilicon layer into the individual floating gates. The etch process first removes approximately 100-200 nm of exposed field oxide and then the chemistry is changed to selectively remove the entire exposed first polysilicon layer while stopping on the underlying tunnel oxide. In addition to forming the floating gates, the first polysilicon layer can also be used to form the select transistor gates 45 and 51 as shown.

After this etch, trenches are formed alongside the first polysilicon strips with lengths in the x-direction. Over the active regions these trenches will extend the full height of the floating gate plus the thickness of masking layers 93 and 95, and over the field regions they will extend 100-200 nm as was formed during the first polysilicon separation step described previously. It is in these trenches that the control gate lines 81-84, select gates lines 80 and 85, and source and bit line contacts are formed. But before forming these control gate lines, ions are implanted in the trenches in regions noted on areas of the plan view of FIG. 3 that are lightly dotted. The cross-sectional view of FIG. 4 shows such memory transistor and select gate implanted source and drain regions 67, 72, 105, 106, 62 and 57. N+ ions may typically be implanted with a dose within a range of 5E13-1E15. A dielectric layer 103 is then formed over the exposed surfaces of the structure, including conforming to the sidewalls and bottom surfaces of the newly formed trenches. The layer 103 is preferably ONO but may also be a material having a higher dielectric constant.

A second layer of doped polysilicon is then deposited over the array area, including completely filling the trenches and contacting the dielectric layer 103. This polysilicon is then removed from the top of the structure by CMP, down to the nitride layer 95 (or alternately to the portion of ONO layer 103 immediately in contact with layer 95) that is used as a stop, followed by a controlled etch of the polysilicon a small distance into the trenches. This polysilicon is also removed using a masking step from those regions of the periphery and array in which contacts to source & drain regions are desired. The control gate lines 81-84, the SSL line 80, and the DSL line 85 are the result. These lines are made to extend at least as high as the floating gates to which they are capacitively coupled through the dielectric layer 103.

Since these narrow control gate lines are typically driven from one end and extend over a significant portion of the memory array, their series resistance is of concern. Consequently the doped polysilicon may be replaced or supplemented with a variety of materials to address this concern. The tops of the control gate lines may be silicided and a thicker layer than normal may be used in this application since they are defined by CMP rather than chemical etching. Alternatively, another conductive material, such as tungsten or molybdenum, may be used instead of the doped second polysilicon. In yet another embodiment the control gates can be formed as a hybrid of polysilicon capped by low resistivity metallic interconnect. This can be accomplished for example when the top exposed surfaces of the second polysilicon control gate lines 81-84 are partially etched down, then is coated with a thin sputtered layer of a barrier metal followed by the deposition of a metallic layer such as tungsten or molybdenum. This composite layer is then etched back employing CMP using the nitride masking layer as etch stop. The resulting interconnect structure provides strips of narrow low resistivity metallic word lines running in the x-direction, being in electrical contact with the underlying second polysilicon in the trenches, and isolated from adjacent similar word lines by the masking dielectric layer 95 laying on top of the floating gates. FIG. 5B shows a cross section through section C-C of FIG. 3 at this stage of the process.

Next, all periphery circuits and transistors are formed, the array of NAND strings is covered with a dielectric insulation layer (not shown), and one or more layers of standard via/metalization (aluminum or copper interconnects) follows to provide electrical access to all bit lines, source lines, word lines and access transistors. These metalization layers can be used as local or global interconnects to reduce the resistivity of long word lines that may become exceedingly narrow and therefore quite highly resistive across large memory arrays.

There are several methods of interconnecting the select gates and implementing the source and drain contacts. One such method is illustrated in FIGS. 3-5 in which the SSL 80 and DSL 85 lines are formed from P2 (the same material as the word lines). The select gate transistors use P1 as their gate material, which should be directly contacted and not left floating. One way to accomplish this is with a direct contact between the horizontal P2 line and each P1 gate. After a first P2 thickness is deposited, a mask is used to selectively remove the ONO layer 103 only on the side of the SSL select gate nearest the common source line contact and on the side of the DSL select gate nearest the bit line contact. Then a second P2 layer is deposited such that the combined thickness of P2 after CMP polishing and etch-back as described earlier is as shown in FIG. 4. This second P2 deposition makes ohmic contact with both the first P2 deposition and the P1 gate material and allows the P2 SSL and DSL lines to directly contact the P1 gates of the respective select transistors. Contacts to the source select transistor's source region which is common to many NAND strings can be made using a horizontal metal line (M0 79 in FIG. 3), and contacts to the drain select transistor's drain region are made to a vertical metal line (not shown), one metal line for each column of NAND strings. These connections are typically made at the same time as the interconnections in the periphery region. An alternate method (not shown) of making contact to the select gates is to use a mask to open contact regions on top of each gate and interconnect these regions with a horizontal poly or metal line located directly above the select transistors gates, again typically during formation of the periphery circuits and interconnections.

Because the control gates are formed along side the floating gates, the structure of FIGS. 3-5 has a more planar topography than the usual NAND array. A primary advantage of this structure is the increased coupling area between the floating gates and the control gates, which leads to an improved capacitive coupling ratio, which in turn allows lower control gate voltages to be used during operation of the memory cell array. Additionally, positioning of the control gate lines between the floating gates in the strings shields these floating gates from each other, thereby significantly reducing, or even eliminating, the undesirable coupling between adjacent floating gates in the column direction. Also, as best shown in FIG. 4, the control gate lines 81-84 can be capacitively coupled through the dielectric layers 91 and 103 with the ion implanted source and drain regions in the substrate 77, and thus employed to raise (boost) the voltage of the substrate surface 79 in these regions. The level of the ion implantation can be made less than usual if the control gate lines are used to control the level of conduction through the implanted regions under them, which this structure allows.

Additionally, and perhaps most importantly, advantage may be taken of future reductions of the process pitch to reduce the sizes of floating gates and other elements, and the spaces between them, even though the thickness of the floating gate oxide layer is not reduced. If the thickness of the floating gate oxide is not reduced then the voltage on the floating gate cannot be reduced. However, if the coupling ratio or coupling area between the floating gate and the control gate can be increased, the control gate voltage can be reduced consistent with the requirements of the process shrink. Use of dual control gates coupled to opposing sidewalls of individual floating gates along with increased thickness of the floating gate provides this increased coupling area.

Second NAND Array Embodiment

A modification of the memory cell array of FIGS. 3-5 is shown in FIGS. 6-10, which are cross-sectional views along a NAND string in the y-direction after sequential processing steps are performed. FIGS. 4 and 10, of the first and second embodiments at comparable stages of their formation, show that the number of memory cell floating gates included in the same length of the NAND string is much higher in FIG. 10 than in FIG. 4, almost twice as many. The structures appear in the x-direction to be the same. The structure of this second embodiment has the same features and advantages described above for the first embodiment, plus a significantly smaller memory cell size in the y-direction. This is accomplished by a novel combination of undercutting and use of spacers to form elements smaller than the smallest lithographically resolvable element size of the process being used.

FIG. 6 shows a cross section B-B along the x-direction of the array of FIG. 3 after a first series of processing steps to form the vertical strips of polysilicon P1 (later to become the floating gates) separated by the STI field oxide according to the second embodiment. The initial steps in forming the intermediate structure of FIG. 6 are the same as described above for the first embodiment as shown in FIG. 5A at a comparable stage of the process. A substrate 111 is appropriately doped to contain one or more wells and a layer 115 of tunnel oxide is grown over a surface 113 of the substrate. A layer of doped polysilicon is then deposited over the oxide, an oxide pad formed on its top, a nitride layer formed over that and the polysilicon/dielectric layers then etched into strips extending in the y-direction. The STI trenches are then formed between the polysilicon strips and filled with oxide. The excess oxide is removed by CMP down to the nitride layers used as a stop. One difference with the first embodiment is that the nitride layer corresponding to 95 of FIG. 5A has been removed from the oxide pad 119, for example using a wet etch.

Next, a relatively thick (50-200 nm.) dielectric layer 121, such as densified silicon dioxide, is then deposited over the oxide pad 119 as shown in FIG. 7. A photoresist mask 123 is then formed over this dielectric layer with strips extending in the x-direction, and having widths and spacing in the y-direction determined by the lithographically minimum resolvable element size. The dielectric layers 121 and 119 are then etched through this mask. The width of the resulting strips can be made smaller than the width of the mask strips by undercutting or over-etching sideways. Resulting relatively thick dielectric strips 121 extending in the x-direction across the polysilicon strips and isolation oxide between them is narrower than the mask strips 123 through which they are formed. The oxide pad 119 is also removed as a result of this etching step. This etching step is controlled in order not to remove excessive amounts of isolation oxide between the polysilicon strips (regions 97-100 in FIG. 6).

A next series of steps are illustrated by FIG. 8. After the mask 123 is removed, a thin (approximately 5 nm. thick) oxide pad 125 is reformed on the surface of the polysilicon strips. This is followed by depositing silicon nitride over the array, typically using an LPCVD process, and then anisotropically etching the nitride to leave spacers 127 along the walls on both sides of the oxide strips 121. The thickness of the deposited nitride primarily determines a length L of the spacer, which in turn (as described later) determines the length of the floating gates, which is significantly less than the minimum width of the process being used to form the structure. A width W of the undercut oxide strips and the length L of the spacers (FIG. 8) are preferably chosen to result in substantially equal spacing of the spacers 127 along the lengths of the polysilicon strips 117, since (as described later) this determines the spacing of the resulting floating gates in the y-direction. It will also be noted that the materials for the strips 121 and spacers 127 may be exchanged, the strips 121 being a nitride and the spacers 127 being an oxide, as the importance of the materials used is to allow removal by etching of the strips 121 while leaving the spacers 127 intact.

This removal and other steps are illustrated by FIGS. 8 and 9. The gaps between the nitride spacers 127 (FIG. 8) are first filled with oxide so that etching away the oxide strips 121 does not result in over etching the field isolation oxide that is exposed between the NAND strings. CMP then removes any excess oxide, down to tops of the nitride spacers 127 used as CMP stops. This oxide between the spacers 127 and the oxide strips 121 are then anisotropically etched together back to the top surface of the polysilicon layer 117, which may be used as end point detection to terminate this oxide etch. Alternatively, to protect the exposed isolation oxide between the memory cell strings, this isolation oxide could be masked with a material that is not etched as the oxide strips 121 are removed, and this masking material then removed after the oxide strips 121 have been removed.

A next step is to use the remaining nitride spacers 127 as a mask to separate the polysilicon strips, such as the strip 117, into islands of isolated floating gates. Anisotropically etching the polysilicon leaves floating gates 131-138. The source and drain ion implantation then takes place, using the floating gates and covering nitride spacers as a mask. The N+ ion implant dose can be within a range of from 5E13 to 1E15. Implanted regions 141-147 between the floating gates are the result. It should be noted that even though floating gate structures 131-138 may be tall and extremely thin, they are nonetheless mechanically stable by virtue of support from adjoining walls of the isolation oxide.

Referring to FIG. 10, a next step is the formation of a dielectric layer 151 that conforms to the outside surface of the memory array, as it exists in the stage illustrated in FIG. 9. The dielectric 151 is preferably made of ONO to a thickness of between 100 and 200 nm. Next, a second layer of doped polysilicon is deposited by LPCVD over the array to completely fill the gaps between floating gates in contact with the dielectric layer 151. Excess polysilicon material is then removed by CMP back to the nitride layer material in the ONO layer 151, or, if ONO is not used, to the tops of the nitride spacers 127 that remain as part of the structure. An additional polysilicon etching step is desirable in order to remove any stringers that may remain across the nitride spacers 127. The result is separate control gate lines 153-159. In order to increase their conductivity, they may be formed and treated using any of the variations as described in the first embodiment. The exposed surface of the structure is then covered by a passivation dielectric layer, following by forming metal conductive lines and vias to connect the lines with source and drain regions at the end of the memory cell strings, and the control gate lines along their lengths.

It can be observed from FIG. 10 that the structure of the second embodiment has all the advantages described above for the first embodiment, plus a higher density of floating gates along the NAND strings. This added advantage results from making the length L of the floating gates and space W between them smaller than the minimum definable lithographic feature size.

Other Features

With reference to FIG. 11, an additional advantage in the operation of an array according to either of the first and second embodiments is illustrated. The typical NAND string, as it is further scaled down, begins to suffer more severely from edge trapping of electrons in the oxide at the side edges of the floating gate, as indicated at 161 and 163. After extended cycling (programming and erasing), some tunneled electrons remain trapped in thicker portions of the oxide immediately adjoining the tunnel oxide over the channel region. This trapped charge contributes to the conduction state of the memory cell transistor; the more trapped electrons, the higher the threshold voltage during read. However, if, subsequent to programming the device is stored at a relatively high temperature (e.g. 125° C.), this oxide trapped charge may be ejected back into the substrate. This is called "relaxation", and can result in a threshold voltage that is 0.3v-0.7v lower than the threshold voltage immediately after programming. This relaxation can be a significant problem, particularly when operating at more that two storage states per floating gate ("multi-state" or "MLC") operation. It can result in data loss in all cells that have been previously heavily programmed.

This relaxation effect is partially or entirely eliminated in either of the embodiments described above by the presence of the control gate lines (CG1 and CG2) in close proximity to the edges of tunnel dielectric at the edges of the floating gate (FG), and the high voltages applied to these control gates during programming. This results in trapping of electrons outside the channel region at trapping sites that are much deeper into the oxide insulator, and therefore are far less susceptible to relaxation after storage at high temperatures.

FIG. 12 illustrates a modification that may be made to either of the embodiments described above, in a cross-sectional view taken along a NAND memory cell string. The process flow may be modified to introduce shallow cavities or trenches in the active silicon between adjacent floating gate transistors in the NAND series string. Two such trenches 165 and 167 are shown in FIG. 12. The trenches are formed by etching into the substrate to a depth of between 20 nm to 50 nm, and is performed after the floating gates have been formed and the exposed tunnel dielectric between them has been removed. Prior to deposition of the second polysilicon layer from which the control gate lines are formed, the silicon of these shallow trenches is implanted with phosphorus or arsenic, typically to a dose of between 5E13 and 1E15 at a low energy, to form source and drain regions 169 and 171.

Alternatively, a p-type doping of the memory cell channel regions of the substrate, which typically takes place at an initial stage of the processing, can be made sufficiently low that the silicon surface in these trenches is inverted when the overlying control gate is held to a slightly positive voltage ($V_{CG}$>0.5V). In this alternative embodiment of field induced inversion in the source and drain regions between adjacent transistors in the NAND string, the control gate voltages are set at a sufficiently positive voltage to induce an inversion layer along the surface of the trenches and therefore permit conductivity between adjacent floating gate transistors along the NAND string. In this alternative embodiment, the N+ implant into the silicon source and drain regions along the NAND string is either at a very low dose, perhaps between 1E13 and 5E13, or is altogether omitted. Use of a field induced inversion layer to facilitate electronic conduction thru the entire series NAND string outside of the floating gate transistors can further improve the programming and erasing cycle endurance, because even a low dose of N+ implant (which is currently necessary but is hereby avoided) can cause damage to the tunnel dielectric at the edges of the floating gate, and may therefore be preferentially avoided. In either case, whether or not the silicon in this trench is implanted N+ or not, the boosting capacitance between the control gate lines and the substrate is increased substantially by virtue of this very shallow trench, even if the lateral spacing W between adjacent floating gates is very small.

Operation of the NAND Array Embodiments

The fundamental element of the new NAND cell structure of both embodiments described above is the formation of two, rather than one, control gates, for each floating gate, rather than stacking the control gate over the floating gate as is traditional. A schematic representation of this is given in FIG. 13 to show the coupling between the gates. Capacitive coupling $C_{CF1}$ and $C_{CF2}$ exists between opposing sidewalls of a floating gate FG and respective adjacent control gates CG1 and CG2 on opposite sides of the floating gate. This coupling is through the ONO or other interpoly dielectric (not shown) that is positioned between these gates. Also, capacitive coupling $C_{FS}$ between the floating gate FG and the substrate through the tunnel dielectric (not shown). None of the control gates necessarily couples to the floating gates from their top surfaces, as is customary in conventional structures. Thus most of the coupling between the two control gates and the floating gates of each transistor is along the vertical walls that they share.

The capacitive coupling ratio of the floating gate transistor in the new configuration can be improved greatly from an increased physical height of the floating gate and an opposing control gate. With reference to FIG. 13, the coupling ratio is approximately:

$$\gamma = \frac{C_{CF1} + C_{CF2}}{C_{CF1} + C_{CF2} + C_{FS}} \quad (1)$$

Typically, the tunnel dielectric of capacitor $C_{FS}$ includes an $SiO_2$ film of thickness between 7 and 9 nanometers, while the dielectric of capacitors $C_{CF1}$ and $C_{CF2}$ is typically a sandwich ONO dielectric with an oxide equivalent electrical thickness of between 14 and 18 nanometers. Therefore, if the area of capacitive coupling along each of the two vertical walls of the floating gate is twice the area of channel coupling, then the coupling ratio equals approximately 0.66, which is quite adequate for proper device operation. If a higher value is desired, so that maximum program and erase voltages can be further decreased, this can be readily achieved by forming all floating gates with a greater thickness. This increases the coupling area with adjacent control gates, without increasing the coupling area of the floating gates with the substrate. The new structure provides a path to scaling down minimum floating gate transistor feature size without reducing the coupling ratio $\gamma$, and without the need to maintain very high program and erase voltages in highly scaled NAND devices.

Since the dual control gates are in close physical proximity to the substrate, a capacitive coupling $C_{CS1}$ and $C_{CS2}$ between each of the respective control gates CG1 and CG2 and the underlying source and drain N+ diffusions is significantly enhanced relative to the standard NAND that has the control gate on top of the floating gate. In effect these dual control gates also serve the function of booster plates that have been suggested by others to be included in addition to the floating and control gates. The control gates of the NAND structures described herein have the same beneficial effect on channel boosting during the program inhibit mode, yet they do so without the need for a separate booster plate with its attendant problems.

The basic operating principles of the dual gate NAND embodiments described above for erasing, programming, program inhibit, and reading are quite similar to the standard NAND structure, except that the specific control gate (word) line voltages need to be applied to the two control gates straddling the selected row of NAND transistors, one from either side. Furthermore, because each of the selected control gates is also capacitively coupled to the floating gate of the NAND transistor floating gate on its other side, capacitive coupling with appropriate voltages on adjacent word lines has to be employed to prevent program disturb conditions or read-inhibit conditions.

A set of exemplary voltages that perform these operations in the NAND embodiments described above is given in the table of FIG. 15. As an example, consider that the row of floating gates 28, 31, 34, 37 and 40 (FIGS. 3 and 14) is being accessed for programming. A single floating gate capacitively coupled with two control gates results in an equivalent capacitor divider circuit. Assuming for the purpose of illustration that each of the three capacitances of each of the floating gates with the control gate 82, the control gate 83 and the substrate ($C_{CF1}$, $C_{CF2}$ and $C_{FS}$ in FIG. 13) are equal. If 20 volts ($V_{CG1}$ and $V_{CG2}$) are applied to each of the control gates lines 82 and 83 and 0 volts to the substrate, then the voltage of each of the floating gates in the row will be the sum of these three voltages (40 volts) divided by 3, or 13.3 volts Therefore, there is a voltage drop of 13.3 volts across the tunnel dielectric layer separating the floating gate from the substrate channel region. This creates an extremely high electric field that causes electrons to tunnel from the substrate through the gate dielectric and onto the floating gate (Fowler-Nordheim tunneling). Note that in this discussion we are not including the voltage contribution coming from net negative or positive charge on any floating gate from a previous erase or programming operation.

Programming voltages are typically applied in pulse sequences, with typical pulse duration of several microseconds. At the same time that the row of floating gates 28, 31, 34, 37 and 40 is being programmed, the unselected rows of floating gates on either side of this row should not be allowed to be affected. Floating gates 27, 30, 33, 36 and 39 are in one of these adjacent rows and floating gates 29, 32, 35, 38 and 41 in the other (FIGS. 3 and 14). However, one side of each of these floating gates is capacitively coupled to one of the control gates 82 and 83 that are at 20 volts, in this example. But the opposite side of each of these floating gates is at the same time capacitively coupled with either of the control gates 81 or 84. If the voltages on these control gates are set to 2 volts and the substrate is 0 volts, the floating gate voltages in these unselected rows will be about 7.3 volts. This voltage across the floating gate oxide will be insufficient to cause electrons to tunnel through the oxide from the substrate channel during the programming pulses.

It will be noted from the table of FIG. 15 that the voltages applied to control gates not along the selected row of control gates are set to different voltages, depending upon whether the row is below or above that being programmed or read. This assumes a type of NAND in which the rows are programmed sequentially in order starting from the side of the array connected to VS. Thus, in the example of FIGS. 3 and 14, the earlier rows of floating gates below the selected are known to have already been programmed. Similarly, in a programming operation, it is also known that the later rows above the selected row are in the erased state. For proper programming, it is required that the bit line voltage (0V) be applied at the channel of the floating gate transistor being programmed. This in turn requires that all series transistors in the NAND chain that are between the cell being programmed and the bit line, be turned on during this programming. This requires the corresponding control gate voltages to be above 0V, typically 1V to 2V. Further, although this discussion references the array of FIGS. 3 and 14, which are more specifically associated with the first embodiment described above than the second, an array according to the second embodiment is operated in the same way.

For proper read sensing to occur, all of the unselected transistors in the NAND should be conducting, i.e. in their "on" state, to allow proper interrogation of the one selected memory cell transistor in each string that is in the selected row. Assuming it requires a minimum of 3.3 volt on the floating gate to ensure conduction in a memory transistor programmed to the highest threshold state, and that capacitances between floating gate to substrate and floating gate to adjacent control gate are all equal, then the sum of the two adjacent control gate voltages should be a minimum of 10 volt. FIG. 16 shows one NAND string consisting of 8 transistors (T0-T7) and 9 word lines (WL0-WL8) for simplicity, but it is assumed that the actual array consists of multiple parallel NAND strings, each with 16, 32 or more transistors as described previously in regard to FIGS. 3 and 14. Assuming multi-state transistor T4 is selected for reading and that the desired reading mechanism is successive increase of the floating gate voltage until bit line conduction is observed, the voltage on the floating gate should be increased sequentially from a low value to the high value (3.3 volt) in nearly as many steps as there are states in the cell. For example, if four states are stored in the cell, at least three voltage steps are required to differentiate between the four states.

There are a variety of ways to satisfy this condition. One possible approach is to place $V_{R0}$ volt on both of the word lines (WL4 and WL5) immediately adjacent to the selected transistor (T4), 10-$V_{R0}$ volt on the next adjacent word lines (WL3 and WL6) both above and below the selected cell, and continue this alternating pattern of $V_{R0}$ volt and 10-$V_{R0}$ volt on all the remaining word lines working outward both above and below the selected transistor until voltages are applied to all word lines. $V_{R0}$ is chosen as the control gate voltage that when applied to both of the adjacent control gates will distinguish the lowest threshold state (erase) from the lowest programmed charge storage state ("1"). Typical values would be between 0 and 1 volt. Then the bit line current is sensed to determine presence or absence of conduction. These voltage conditions result in all unselected transistors having a voltage of 10 volt on the sum of their adjacent control gates resulting in a floating gate voltage of 3.3 volt which is above the highest possible floating gate state and will guarantee conduction of all unselected transistors. To read the next state of the selected cell all word lines at $V_{R0}$ volt are set to a new voltage, $V_{R1}$, and all word lines at 10-$V_{R0}$ volt are set to a new voltage 10-$V_{R1}$ and the absence or presence of bit line current is sensed. In a similar fashion to $V_{R0}$, $V_{R1}$ is chosen to distinguish between the lowest programmed state ("1") and the next highest programmed state ("2"). This process is continued until all possible programmed states are sensed. This approach maintains a constant and minimum necessary voltage on each floating gate and tends to minimize the possibility of a read disturb condition to the charge state of all floating gates.

An alternate approach to read the selected floating gate state is to place $V_{R0}$ volt on both of the word lines (WL4 and WL5) immediately adjacent to the selected transistor (T4), 10-$V_{R0}$ volt on the next adjacent word lines (WL3 and WL6) both above and below the selected cell, and 5 volts on all remaining word lines. As the voltage on the selected word lines is raised, the voltage on the two adjacent word lines can be lowered by the same amount. This approach has the advantage that a maximum of four control gates are being switched but has the disadvantage that the transistors adjacent to the selected transistor are continually stressed more than necessary because their floating gate voltage is held at 5 volts rather than 3.3 volts as in the previous approach.

Erase by block is performed the same way as prior art NAND blocks. All control gates in a block are either at 0V (erased block) or floating (non-erased block) while the local substrate (p-well and underlying n-well) for the entire array is raised to ~20V.

It will be understood that the voltages shown in the table of FIG. 15 are provided by way of an example only, and other voltages may work equally well or even better. For example, it may be preferable to sequence the voltages applied to the dual control gates addressing a certain floating gate, so as to avoid spiking and excessively high voltages. Furthermore, it may be advantageous to set the specific voltage on any control gate in the addressed NAND string to a certain voltage level and then let it float at that voltage level during the subsequent read, write or erase operation, relying on the capacitive coupling that exists between every control gate word line and it's adjacent structures to dynamically maintain the floated voltage on said control gate. This concept may be employed to use global word lines to access and selectively set the voltages on more than one local control gate (word) lines. Furthermore, as the thicknesses of the various dielectric layers adjacent to each floating gate are scaled down in future generations, all voltages should be correspondingly scaled down to avoid excessively high electric fields with their attendant possibility of shorts and destructive dielectric breakdown.

CONCLUSION

Although the various aspects of the present invention have been described with respect to exemplary embodiments thereof, it will be understood that the present invention is entitled to protection within the full scope of the appended claims.

The invention claimed is:

1. A non-volatile memory for programming and reading data, comprising:
 a plurality of charge storage elements arranged in rows and columns across a semiconductor substrate,
 a plurality of control gate lines extending across the charge storage elements in a manner that opposing sidewalls on opposite sides of individual charge storage elements are capacitively coupled with at least two of the control gate lines, and
 a decoder and voltage supply connected to the control gate lines to couple controlled voltages to the charge storage elements capacitively coupled therewith during programming data thereto and reading data therefrom.

2. The memory of claim 1, wherein the control gate lines are additionally capacitively coupled with the substrate in areas between charge storage elements.

3. The memory of claim 2, additionally comprising trenches formed in the substrate between the charge storage elements in the path of the control lines, the control gate lines extending into said trenches with a dielectric layer between the control lines and the substrate.

4. The memory of claim 1, wherein the memory cells are oriented in a plurality of series connected strings of memory cells, and wherein the control gates extend across multiple strings of memory cells between the charge storage elements.

5. The memory of claim 4, additionally comprising dielectric filled isolation trenches in the substrate between the plurality of strings of memory cells.

6. A non-volatile memory for programming and reading data, comprising:
 an array of charge storage elements positioned across a semiconductor substrate,
 a plurality of control gate lines extending across the array in a manner that opposing sidewalls of individual charge storage elements are capacitively coupled with at least two of the control gate lines, and
 a decoder and voltage supply connected to the control gate lines to couple controlled voltages to the charge storage elements capacitively coupled therewith during programming data thereto and reading data therefrom,
 wherein the memory cells are oriented in a plurality of series connected strings of memory cells, and wherein the control gates extend across multiple strings of memory cells between the charge storage elements, and
 wherein the control gates include a combination of doped polysilicon as a bottom portion of a height of the control gates and a metal or silicide material in contact therewith as a top portion of the height of the control gates.

7. A non-volatile memory for programming and reading data, comprising:
 a plurality of charge storage elements positioned across a semiconductor substrate with rows of the charge storage elements extending in a first direction and columns of charge storage elements extending in a second direction, the first and second directions being perpendicular with each other,
 a plurality of control gate lines extending across the plurality of charge storage elements in the first direction and being spaced apart in the second direction between adjacent rows of charge storage elements in a manner that opposing sidewalls on opposite sides of individual charge storage elements of the rows are capacitively coupled with at least two control gate lines on opposite sides of the charge storage elements, and
 a decoder and voltage supply connected to the control gate lines to couple controlled voltages to the charge storage elements capacitively coupled therewith during programming data thereto and reading data therefrom.

8. The memory of claim 7, wherein
 the control gate lines are additionally capacitively coupled with the substrate in regions thereof between the charge storage elements in the second direction, and
 the decoder and voltage supply additionally provides voltages to the control gate lines for controlling a level of conduction in the substrate regions between the charge storage elements in the second direction.

9. The memory of claim 7, wherein the decoder and voltage supply provides different voltages to various of the control gate lines at one time.

10. The memory of claim 7, wherein ends of the columns are controllably connected with voltage supply levels.

11. The memory of claim 8, wherein ends of the columns are controllably connected with voltage supply levels.

12. The memory of claim 1, wherein the charge storage elements are conductive floating gates.

13. The memory of claim 7, wherein the charge storage elements are conductive floating gates.

* * * * *